(12) United States Patent
Pruegl

(10) Patent No.: US 10,006,968 B2
(45) Date of Patent: Jun. 26, 2018

(54) XMR SENSOR DEVICE

(71) Applicant: Infineon Technologies AG, Neubiberg (DE)

(72) Inventor: Klemens Pruegl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 230 days.

(21) Appl. No.: 14/804,454

(22) Filed: Jul. 21, 2015

(65) Prior Publication Data

US 2016/0025819 A1 Jan. 28, 2016

(30) Foreign Application Priority Data

Jul. 24, 2014 (DE) .................. 10 2014 110 438

(51) Int. Cl.
*G01R 33/09* (2006.01)
*G01R 33/00* (2006.01)

(52) U.S. Cl.
CPC .......... *G01R 33/0005* (2013.01); *G01R 33/09* (2013.01)

(58) Field of Classification Search
CPC .... G01R 33/09; G01R 33/093; G01R 33/098; G01R 33/096; G01R 33/0052; G01R 33/091; G01R 33/0011; B82Y 25/00; B82Y 10/00; B82Y 40/00; B82Y 30/00
USPC ....... 324/331, 333, 366, 463, 228, 232, 246, 324/252, 259, 260–263, 529, 754.29, 179; 360/324.11–324.12
See application file for complete search history.

(56) References Cited

U.S. PATENT DOCUMENTS

| | | | |
|---|---|---|---|
| 5,701,222 A | 12/1997 | Gill et al. | |
| 7,535,215 B2 | 5/2009 | Forster | |
| 7,906,961 B2 | 3/2011 | Abwa et al. | |
| 2002/0149358 A1 | 10/2002 | Doescher | |
| 2004/0114280 A1 | 6/2004 | Yoshikawa et al. | |
| 2005/0045913 A1* | 3/2005 | Nguyen | B82Y 25/00 257/200 |
| 2005/0195535 A1* | 9/2005 | Shi | B82Y 25/00 360/324.12 |
| 2005/0219770 A1* | 10/2005 | Gill | G11B 5/39 360/324.2 |
| 2005/0246114 A1 | 11/2005 | Rannow | |
| 2005/0270020 A1* | 12/2005 | Peczalski | B82Y 25/00 324/247 |
| 2005/0280957 A1 | 12/2005 | Gill | |
| 2006/0067014 A1* | 3/2006 | Freitag | B82Y 25/00 360/324.12 |
| 2008/0074802 A1* | 3/2008 | Carey | B82Y 25/00 360/324.1 |
| 2008/0084205 A1* | 4/2008 | Zimmer | B82Y 25/00 324/252 |
| 2008/0116885 A1* | 5/2008 | Van Zon | G01L 5/223 324/207.21 |
| 2008/0259507 A1* | 10/2008 | Lin | B82Y 10/00 360/324.1 |
| 2009/0015252 A1* | 1/2009 | Raberg | B82Y 25/00 324/252 |

(Continued)

*Primary Examiner* — Patrick Assouad
*Assistant Examiner* — Taqi Nasir
(74) *Attorney, Agent, or Firm* — Eschweiler & Potashnik, LLC

(57) ABSTRACT

Sensor devices and methods are provided where a second magnetoresistive sensor stack is provided on top of a first magnetoresistive sensor stack.

16 Claims, 3 Drawing Sheets

(56) References Cited

U.S. PATENT DOCUMENTS

| | | | |
|---|---|---|---|
| 2009/0059437 A1* | 3/2009 | Gill | B82Y 25/00 360/314 |
| 2009/0059444 A1* | 3/2009 | Mather | B82Y 25/00 360/324.11 |
| 2009/0243608 A1* | 10/2009 | Imai | G01R 33/07 324/252 |
| 2010/0079917 A1 | 4/2010 | Miyauchi et al. | |
| 2010/0142101 A1 | 6/2010 | Sato et al. | |
| 2010/0259257 A1* | 10/2010 | Sasaki | B82Y 25/00 324/252 |
| 2012/0049843 A1 | 3/2012 | Sun | |
| 2012/0119735 A1 | 5/2012 | Zimmer | |
| 2012/0155164 A1 | 6/2012 | Shukh | |
| 2012/0194180 A1 | 8/2012 | Raberg | |
| 2012/0306488 A1 | 12/2012 | Chen | |

* cited by examiner

XMR SENSOR DEVICE

CROSS REFERENCE TO RELATED APPLICATIONS

This application claims priority to German Application No. 102014110438.2, filed on Jul. 24, 2014, and incorporated herein by reference in its entirety.

FIELD

The present application relates to XMR sensor devices and to corresponding methods.

BACKGROUND

Magnetic field sensors are used in many applications. For example, for speed or movement detection, magnets may for example be provided on a so-called pole wheel, thus generating a modulated magnetic field when the pole wheel rotates. The modulation of the field may then be detected by a magnetic field sensor. The magnetic field detected thereby and its modulation are then indicative for example of a rotational speed of the pole wheel. Instead of a pole wheel for example also a tooth wheel or a linear magnetic element generating a modulated magnetic field when moving may be used. Also other applications use magnetic field sensors, for example magnetic storage device like hard disks.

Magnetic field sensors include Hall sensors and sensors based on a magnetoresistive (MR) effect, also referred to as XMR sensors. In many cases, XMR sensors exhibit lower jitter than Hall sensors, which may be important for some applications, for example speed detection in automotive applications and/or indirect tire pressure monitoring systems. However, XMR sensors are sensitive to magnetic fields orthogonal to a sensing direction. Due to this, imprecise positioning of XMR sensors for example relative to a pole wheel or other movable magnetic device may cause jitter to increase.

SUMMARY

According to an embodiment, a device as defined in claim 1 is provided. According to another embodiment, a method as defined in claim 15 is provided. The dependent claims define further embodiments.

DETAILED DESCRIPTION

Figure 1:
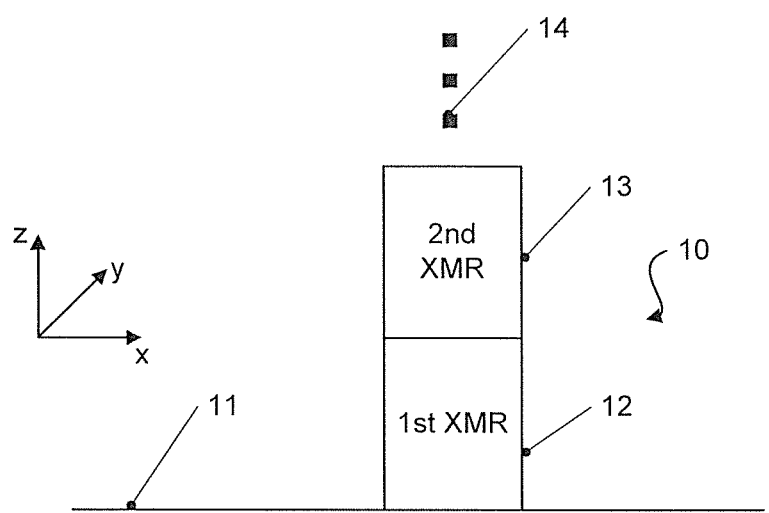
FIG. 1 is a schematic cross-sectional view illustrating a sensor device according to an embodiment.

In the following, various embodiments will be described in detail with reference to the attached drawings. It is to be noted that these embodiments serve illustrative purposes only and are not to be construed as limiting. For example, while embodiments may be described as comprising a plurality of different details, features or elements, in other embodiments some of these details, features or elements may be omitted, may be implemented in a different manner than shown, and/or may be replaced by alternative details, features or elements. Additionally or alternatively, in other embodiments additional details, features or elements not explicitly described herein or shown in the drawings may be provided.

Some embodiments relate to magnetic field sensor devices. A magnetic field sensor device may for example comprise an XMR sensor. The term XMR sensor as used herein may refer to sensors being based on one or more magnetoresistive (MR) effects. Non-limiting examples for magnetoresistive effects include GMR (giant magnetoresistance), CMR (colossal magnetoresistance), AMR (anisotropic magnetoresistance) or TMR (tunneling magnetoresistance).

In some embodiments, a magnetic field sensor device may comprise a first XMR sensor stack and a second XMR sensor stack on top of the first XMR sensor stack. The term "stack" as used herein may refer to a plurality of layers placed on top of each other to form the XMR sensor stack. Each of the first XMR sensor stack and the second XMR sensor stack may comprise a free layer, also referred to as sensor layer, and/or a reference layer. The first and second XMR sensor stacks may be essentially independent from each other regarding their response to external magnetic fields. In some embodiments, a distance between free layers of the first and second XMR sensor stacks may be 15 nm or more, for example 20 nm or more.

In some embodiments, the first XMR sensor stack and the second XMR sensor stack may share one ore more layers, for example an antiferromagnetic layer.

In some embodiments, the first XMR sensor stack and the second XMR sensor stack may be electrically coupled to be operable as a single XMR sensor element. In some embodiments, this may reduce jitter.

Turning now to the Figures, in FIG. 1 a schematic cross-sectional view of an XMR sensor device 10 according to an embodiment is illustrated. XMR sensor device 10 comprises a substrate 11. Substrate 11 may for example be a semiconductor substrate, for example a substrate comprising a silicon wafer, but is not limited thereto. Besides elements discussed in more detail below, electronic devices or circuits may be formed on substrate 11.

On substrate 11, a first XMR sensor stack 11 is provided. On top of first XMR sensor stack 12, a second XMR sensor stack 13 is provided. As indicated by dots 14, on top of second XMR sensor stack 13 one or more further XMR sensor stacks may be provided in some embodiments. First XMR sensor stack 11 and second XMR sensor stack 13 each may comprise a plurality of layers. In some embodiments, first XMR sensor stack 12 and second XMR sensor stack 13 may also share one or more layers, for example an antiferromagnetic layer, as will be described later in more detail.

In the example of FIG. 1, an xy-plane may correspond to a plane of substrate 11 (e.g. a surface of substrate 11 may extend in the xy-direction). A z-direction may correspond to a direction perpendicular thereto, e.g. perpendicular to a surface of substrate 11. In such a coordinate system, second XMR sensor stack 13 is provided on, e.g. stacked on first XMR sensor stack 12 in the z-direction.

It should be noted that the representations in the Figures are schematic only and not necessarily to scale, but chosen for convenience of representation. For example, in some embodiments a width of first and second XMR sensor stacks 12, 13 in the x- and/or y-direction may be higher, for example at least one order of magnitude higher, that a height in the z-direction. For example, the width may be of the order of 10 μm or more, while the height may be of the order of 30-40 nm, just to give an example. This may also apply to XMR sensor stacks explained further below with reference to FIGS. 2-5.

In some embodiments, first XMR sensor stack 12 and second XMR sensor stack 13 may each comprise a free layer (also referred to as sensor layer) and a reference layer. Additionally, each of first XMR sensor stack 12 and second XMR sensor stack 13 may comprise a pinned layer where a magnetization direction is pinned by an antiferromagnetic layer. Other configurations may also be used. In some embodiments, a response of a free layer of first XMR sensor stack 12 to a magnetic field at the free layer of first XMR sensor stack 12 may be essentially independent from a response of a free layer of second XMR sensor stack 13 to a magnetic field at the free layer of second XMR sensor stack 13. In some applications, the magnetic field at the free layer of first XMR sensor stack 12 may be essentially the same as the magnetic field at the free layer of second XMR sensor stack 13. The magnetic fields at the free layers of first and second XMR sensor stacks 12, 13 in embodiments may comprise an external magnetic field to be sensed.

In some embodiments, a sensitive direction of first XMR sensor stack 12 and second XMR sensor stack 13 may be the x-direction. Sensitive direction in this respect may refer to a direction in which a magnetic field is to be measured. In some embodiments, providing two XMR sensor stacks 12, 13 may reduce jitter caused by magnetic fields in the y-direction which is orthogonal to the x-direction. In some embodiments, the jitter may be reduced by a factor $1/\sqrt{n}$, n being the number of XMR sensor stacks provided. This reduction is basically a statistic reduction assuming that the free layers of the stacks are essentially independent from each other. In some embodiments, responses of XMR sensor stacks like the first and second XMR sensor stacks 12, 13 of FIG. 1 to such magnetic fields in the y-direction may differ from XMR sensor stack to XMR sensor stack at least to some extent. Therefore influences of magnetic fields in the y-direction may cancel each other out at least partially when using the XMR sensor stacks together.

In some embodiments, first XMR sensor stack 12 and second XMR sensor stack 13 may be electrically coupled with each other to be operable essentially as a single XMR element. This will be explained with reference to FIGS. 2 and 3.

Generally, a technique for using XMR sensor stacks for magnetic field measurements is to provide a measurement current through the XMR stack(s) and to measure a voltage drop. In other words, a resistance of the layers is measured. This resistance may depend on an external magnetic field to be sensed.

In the following explanations, XMR devices having a first XMR sensor stack and a second XMR sensor stack will be used for illustrative purposes. However, it is to be understood that, as already indicated with respect to FIG. 1, in other embodiments more than two XMR sensor stacks may be provided. In this respect, terms like "comprising a first XMR sensor stack and a second XMR sensor stack" are to be construed as covering also cases where one or more further XMR sensor stacks apart from the first and second XMR sensor stacks are provided.

Figures 2, 3:
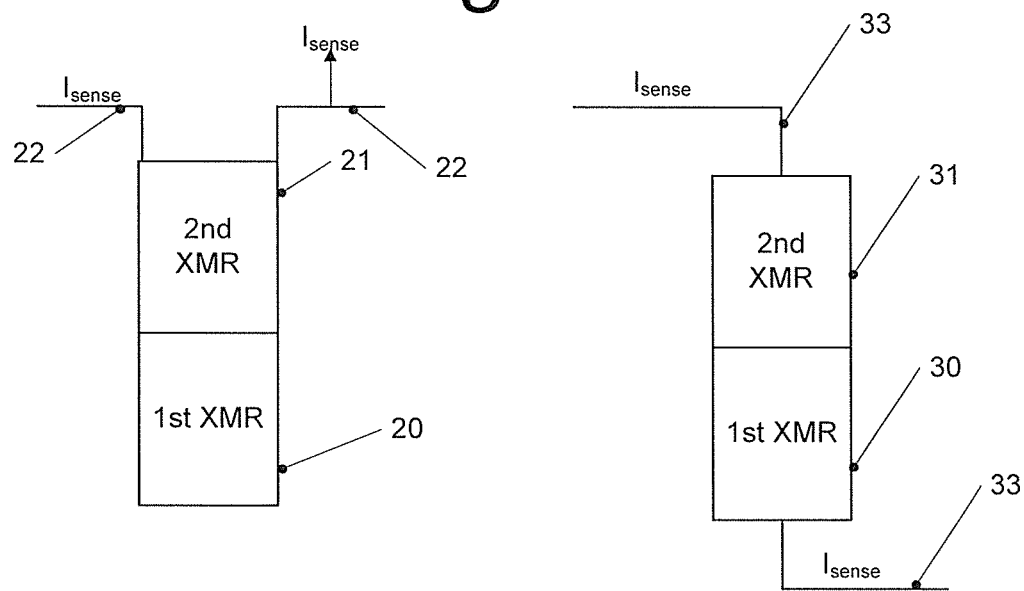
FIG. 2 is a schematic view illustrating electric contacting in a sensor device according to an embodiment.
FIG. 3 is a schematic view illustrating electric contacting in a sensor device according to a further embodiment.

In FIG. 2, an electric coupling between a first XMR sensor stack 20 and a second XMR sensor stack 21 on top of first XMR sensor stack 20 is illustrated. First and second XMR sensor stacks 20, 21 in the embodiment of FIG. 2 may for example be GMR stacks, but are not limited thereto. In GMR sensor elements, in many applications a resistance in a plane defined by the layers of a sensor stack (for example at a surface or interface plane of a free layer) is measured. However, it should be noted that in other embodiments also in GMR sensor stacks a current perpendicular to this plane may be applied, as explained later with reference to FIG. 3. For measuring the above-mentioned resistance in the plane, in the embodiment of FIG. 2 first XMR sensor stack 20 and second XMR sensor stack 21 are coupled in parallel by electrical connections 22 which are illustrated schematically. In case of FIG. 2, as already mentioned with respect to FIG. 1 a width of XMR sensor stacks 20, 21 may be higher than a height of XMR sensor stacks 20, 21, for example by one order of magnitude or more. In some embodiments, with the electrical connections 22 as illustrated in FIG. 2 therefore a sense current $I_{sense}$ therefore flows for example through first XMR sensor stack and second XMR sensor stack essentially in a direction located in a plane of layers of first XMR sensor stack 20 and second XMR sensor stack 21. Electrical connection 22 may be provided by various techniques, for example techniques conventionally used in semiconductor processing for electrically contacting components or layers. For example, electrical coupling between first XMR sensor stack 20 and second XMR sensor stack 21 may be provided by metal deposition and structuring on a substrate like substrate 11 of FIG. 1. Electrical connections 22 shown in FIG. 2 are to be regarded as schematic only, and contacting of first and second XMR sensor stacks 20, 21 may be different than shown, for example at a bottom of first XMR sensor stack 20 or at sides of XMR sensor stacks 20 and/or 21, as long as the sense current flows predominantly in the in-plane direction through the XMR sensor stacks 20, 21.

To measure a magnetic field, e.g. a voltage drop caused by the sense current $I_{sense}$ may be measured in FIG. 2. In other embodiments, a fixed voltage may be applied, and current/sense may be measured.

In FIG. 2, by coupling first XMR sensor stack 20 and second XMR sensor stack 21 in parallel, an overall resistance may be lowered. In some embodiments, this may increase the sense current $I_{sense}$. In other embodiments, $I_{sense}$ may be a fixed current generated for example by a regulated current source.

In FIG. 3, a sensor device according to a further embodiment is illustrated. The embodiment of FIG. 3 comprises a first XMR sensor stack 30 and a second XMR sensor stack 31. In the embodiment of FIG. 3, first XMR sensor stack 30 and a second XMR sensor stack 31 may be TMR stacks, although they are not limited thereto. In TMR stacks, usually a tunneling barrier, for example a MgO tunneling barrier, is provided as one of the layers in both first XMR sensor stack 30 and a second XMR sensor stack 31. A sense current in many TMR applications flows perpendicular to the layer surfaces. However, in other embodiments the sense current may also be an in-plane sense current as explained with reference to FIG. 2. In an embodiment using a sense current perpendicular to the layer surfaces, as illustrated by electrical connections 33, first XMR sensor stack 30 and a second XMR sensor stack 31 may be coupled in series, such that for example the sense current flows through a tunneling barrier of first XMR sensor stack 30 and a tunneling barrier of a second XMR sensor stack 31 consecutively. A resistance may be adjusted by adjusting a thickness of the tunneling barrier. Also in this case, electrical connections 33 may be formed for example by any techniques conventionally employed in semiconductor processing and may be provided in a different manner than shown.

Next, with reference to FIGS. 4 and 5 examples for XMR sensor stacks will be explained in detail.

Figure 4:
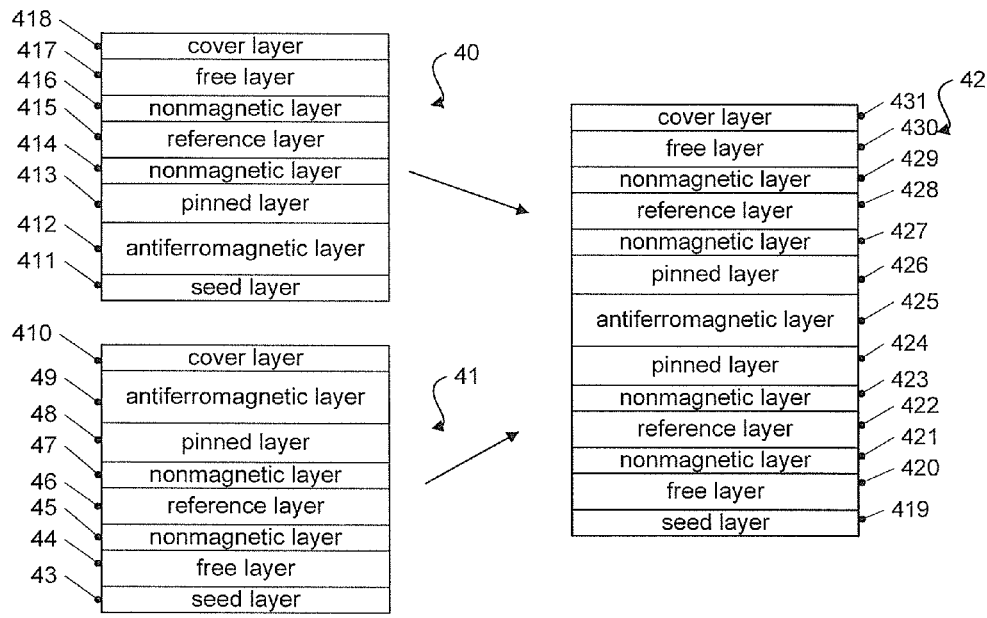
FIG. 4 is a diagram illustrating a layer structure of a device according to an embodiment.

In FIG. 4, an example of a combined stack 42 comprising a first XMR sensor stack and a second XMR sensor stack is illustrated. Stack 42 is essentially a combination of a so-called bottom spin valve 40 and a top spin valve 41. Spin valves 40, 41 may for example be GMR stacks.

Bottom spin valve 40 comprises an antiferromagnetic layer 412 on top of a seed layer 411. Seed layer 411 may comprise any suitable material allowing a deposition of antiferromagnetic layer 412 on top thereof. Antiferromagnetic layer 412 may for example comprise PtMn, IrMn and/or NiMn. Adjacent to antiferromagnetic layer 412, a pinned layer 413 made of a ferromagnetic material, for example CoFe, is provided. A magnetic orientation of pinned layer 413 may be determined by antiferromagnetic layer 412.

On top of pinned layer 413 a non-magnetic layer 414, for example made of ruthenium (Ru) is provided, followed by a ferromagnetic reference layer 415. Reference layer 415 may for example be made of CoFe and/or CoFeB.

On top of reference layer 415 a non-magnetic layer 416 may be provided. Non-magnetic layer 416 may comprise for example Cu or MgO. On top of non-magnetic layer 415, a free layer 417, also referred to as sensor layer, is provided. Free layer 417 may be made of a ferromagnetic material like CoFe, NiFe CoFeB or combination of different ferromagnetic materials. On top of free layer 417, a cover layer 418, for example made of TaN, is provided. Any materials given here are given merely by way of example, and in other implementations other suitable materials may be used.

An external magnetic field may change a magnetic orientation of free layer 417 with respect to pinned layer 413 and/or reference layer 415, which changes the resistance of bottom spin valve stack 40.

Top spin valve stack 41 essentially corresponds to bottom spin valve stack 40 with the order of the layers changed, e.g. essentially reversed apart from a seed layer and a cover layer. In stack 41, a seed layer 43 is followed by a free layer 44 made of a ferromagnetic material, for example CoFe, NiFe CoFeB or combination of different ferromagnetic materials. On top of free layer 44, a non-magnetic layer 45, for example comprising Cu and/or MgO, is provided.

Non-magnetic layer 45 is followed by a ferromagnetic reference layer, for example comprising CoFe and/or CoFeB, followed by a non-magnetic layer 47. Non-magnetic layer 47 may for example comprise ruthenium (Ru).

On top of non-magnetic layer 47, a pinned layer 48 made from a ferromagnetic material like CoFe followed by an antiferromagnetic layer 49 comprising for example PtMn, IrMn and/or NiMn is provided. Antiferromagnetic layer 49 determines a magnetic orientation of pinned layer 48. Free layer 44 changes its magnetic orientation in response to an external magnetic field to be measured relative to an orientation of pinned layer 48 and/or reference layer 46, which changes an resistance of top spin valve stack 41.

Combined stack 42 according to an embodiment as already mentioned is essentially a combination of bottom spin valve stack 40 and top spin valve stack 41.

Stack 42 comprises layers 420-424 on a seed layer 419. Layers 420-424 in an embodiment correspond to layers 44-48 of top spin valve stack 41. On top of pinned layer 424 an antiferromagnetic layer 425, for example made of PtMn, is provided. On top of antiferromagnetic layer 425 layers 426-430 are provided which correspond to layers 413-417 of bottom spin valve stack 40. On top of free layer 430, a cover layer 431, for example of TaN, is provided.

Therefore, stack 42 essentially corresponds to stack 40 on top of stack 41, with the antiferromagnetic layer 425 being shared and only one seed layer 419 and one cover layer 431 being provided. Therefore, in stack 42 antiferromagnetic layer 425 determines a magnetic orientation both of pinned layer 424 and of pinned layer 426. As antiferromagnetic layers and materials used therein in some implementations are comparatively expensive, sharing an antiferromagnetic layer may serve to reduce costs in some embodiments. However, in other embodiments separate antiferromagnetic layers for different XMR sensor stacks may be provided.

In stack 42, free layer 430 and free layer 420 serve as essentially independent sensor layers. "Essentially independent" in this case indicates that they influence each other at best in a negligible manner and independently serve to sense a respective local magnetic field. In some embodiments, through the independent sensing in free layers 420 and 430, at least to some extent the effect of magnetic field components outside a sensitive direction (for example y-direction in the example of FIG. 1) may be statistically reduced, as influences from such fields at free layer 420 and at free layer 430 may cancel each other out to some extent, in particular in case of statistically varying magnetization directions.

To provide independence between free layer 420 and free layer 430, in some embodiments a spacing between free layer 420 and free layer 430 may be more than 15 nm, for example 30 nm or more. In other embodiments, other spacing distances may be used.

Figure 5:
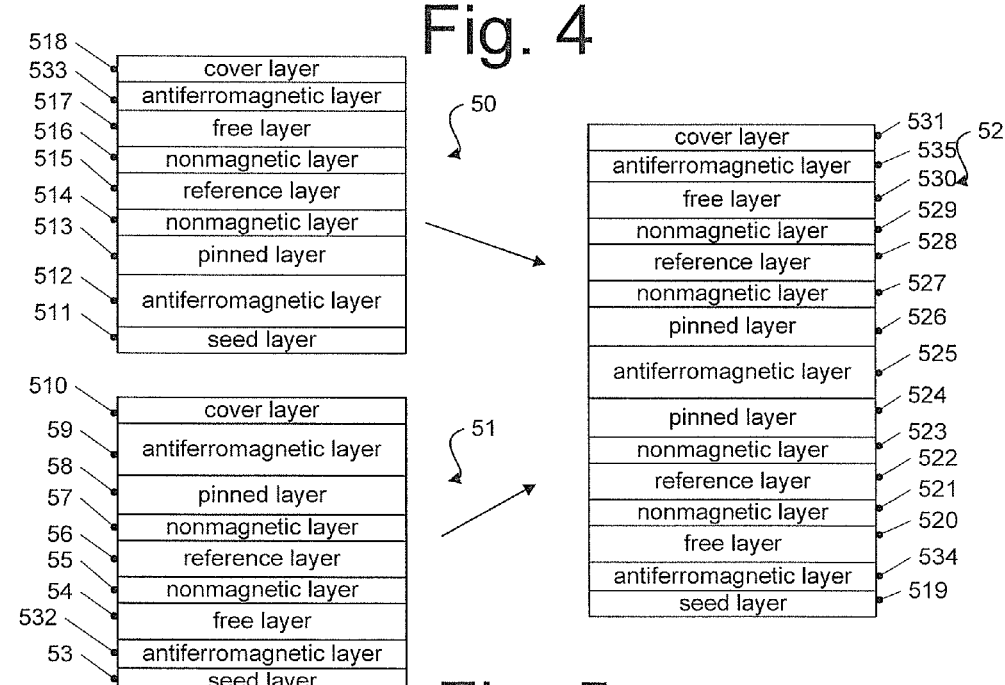
FIG. 5 is a diagram illustrating a layer structure of a device according to another embodiment.

In FIG. 5, a combined stack 52 essentially corresponding to a bottom spin valve stack 50 on top of a top spin valve stack 51 according to an embodiment is illustrated. The embodiment of FIG. 5 essentially is a variation of the embodiment of FIG. 4. In particular, layers 511-518 of bottom spin valve stack 50 correspond to layers 511-518 of bottom spin valve stack 40, layers 53-510 of top spin valve stack 51 correspond to layers 43-410 of top spin valve stack 41, and layers 519-531 of combined stack 52 correspond to layers 419-431 of combined stack 42 of FIG. 4 and will therefore not be described again in detail. Variations and alternatives described with reference to FIG. 4 also may apply to corresponding layers and stacks of FIG. 5. In addition to the embodiment of FIG. 4, in the embodiment of FIG. 5 antiferromagnetic layers are provided adjacent to the free layers. For example, in bottom spin valve stack 50 an antiferromagnetic layer 533 is provided adjacent to free layer 517, and in top spin valve stack 51 an antiferromagnetic layer 532 is placed adjacent to free layer 54. In combined stack 52, an antiferromagnetic layer 534 is provided adjacent to free layer 520, and an antiferromagnetic layer 535 is provided adjacent to free layer 530.

These antiferromagnetic layers 532, 533, 534 and 535 provide a preferential magnetization direction to the respective free layers 517, 532, 520 and 530. This in some embodiments may further help to reduce jitter. The preferential direction for the free layers may be orthogonal to a magnetic orientation caused by antiferromagnetic layer 512, 59 or 525.

The stacks illustrated with respect to FIGS. 4 and 5 serve only as examples, and in other embodiments other systems may be used, for example TMR-systems comprising a tunneling barrier. Furthermore, in some embodiments no shared layers may be used. For example, two bottom spin valve stacks 40 or two top spin valve stacks 41 may be provided on top of each other to provide a combined stack without shared layers. Also, in some embodiments some of the shown layers may be omitted. For example, in some embodiments only a pinned layer and a free layer without an additional reference layers in between may be used. Any other conventional implementations of XMR sensor stacks may also be used, which XMR sensor stacks then may be provided on top of each other to form embodiments.

Figure 6:
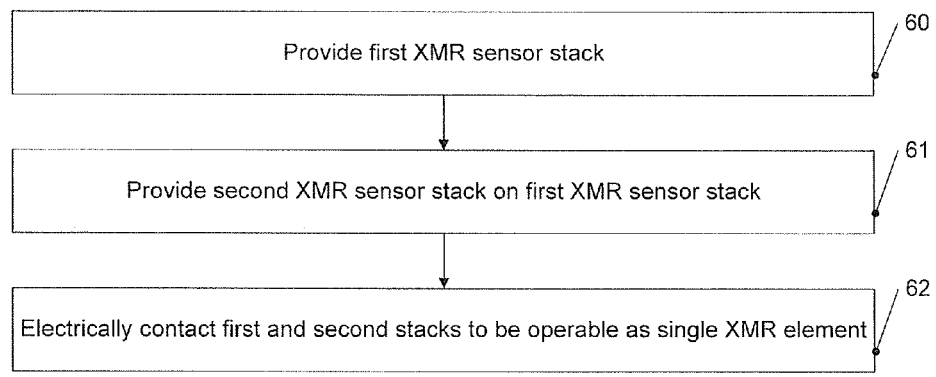
FIG. 6 is a flowchart illustrating a method according to an embodiment.

In FIG. 6, a flowchart illustrating a method according to an embodiment is illustrated. The method of FIG. 6 may for example be used to manufacture any of the embodiments discussed with reference to FIGS. 1-5, but may also be used for manufacturing other embodiments.

At 60 in FIG. 6, a first XMR sensor stack is provided. At 61, the method comprises providing a second XMR sensor stack on the first XMR sensor stack to form a combined stack. The first and second XMR sensor stacks may share one or more layers, for example an antiferromagnetic layer.

At 62, optionally the first and second XMR sensor stacks are electrically contacted to be operable as a single XMR sensor element, for example as illustrated and explained with reference to FIGS. 2 and 3.

Figure 7:
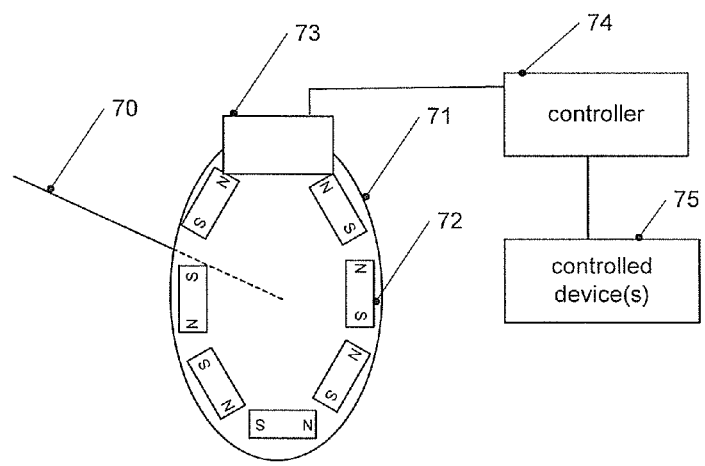
FIG. 7 is a diagram illustrating an application example of a device according to an embodiment.

In FIG. 7, an example application environment for XMR sensor devices according to some embodiments is illustrated. However, it is to be emphasized that this serves merely as an example, and XMR sensor devices according to embodiments may be used in various applications.

The apparatus illustrated in FIG. 7 comprises an XMR sensor device which may comprise a second XMR sensor stack provided on top of a first XMR sensor stack, for example as illustrated with respect to FIGS. 1-5. XMR sensor device 73 is placed adjacent to a pole wheel 71 which is coupled with a rotation axis 70. For example, rotation axis 70 may be coupled to a wheel of a car to enable measuring of a wheel speed or may be coupled with a steering column of a car. However, application of the apparatus illustrated in FIG. 7 is not limited to automotive applications. In other embodiments, instead of pole wheel 71 another magnetic device generating a modulated magnetic field when moving, for example a tooth wheel or a linear magnetic device, may be used.

Pole wheel 71 comprises a plurality of magnets 72 arranged along its circumference. Magnets 72 may be permanent magnets or may for example be electromagnets. The number and/or arrangement of the magnets may differ from the one shown for illustrative purposes in FIG. 7.

When axis 70 and therefore pole wheel 71 rotates, XMR sensor device 73 experiences a modulated magnetic field. This may be used for detection of speed and/or direction. In some embodiments, by providing first and second XMR sensor stacks as described, a jitter of XMR sensor device 73 in particular in cases of a slightly imprecise placement of XMR sensor device 73 with respect to pole wheel 71 may be reduced.

An output of XMR sensor device 73 is fed to a controller 74. In an automotive application, controller 74 may for example be an electronic control unit (ECU) of a vehicle. Depending on the received signal, controller 74 may control one ore more control devices 75. For example, in case of a wheel speed sensing application, controlled devices 75 may comprise components of an anti-lock braking system (ABS), or in case of a rotation detection of a steering column controlled devices 55 may comprise devices relating to steering a vehicle. However, these applications merely serve as non-limiting examples for illustration purposes and are not to be construed as limiting.

What is claimed is:

1. A sensor device, comprising:
a first magnetoresistive sensor stack, the first magnetoresistive sensor stack comprising a first free layer sensitive to a first magnetic field at the first free layer, and
a second magnetoresistive sensor stack provided on top of the first magnetoresistive sensor stack, the second magnetoresistive sensor stack comprising a second free layer sensitive to a second magnetic field at the second free layer,
wherein the first magnetoresistive sensor stack and the second magnetoresistive sensor stack share at least one layer, and
wherein at least one of the first or second magnetoresistive sensor stack comprises an antiferromametic layer provided adjacent to the respective first or second free layer.

2. The sensor device of claim 1, wherein the first free layer is essentially magnetically independent from the second free layer.

3. The sensor device of claim 1, wherein a spacing between the first free layer and the second free layer is 15 nm or more.

4. The sensor device of claim 1, wherein the first magnetoresistive sensor stack and the second magnetoresistive sensor stack are based on at least one of a giant magnetoresistance, an anisotropic magnetoresistance, a colossal magnetoresistance or a tunneling magnetoresistance.

5. The sensor device of claim 1, wherein the at least one shared layer comprises an antiferromagnetic layer.

6. The sensor device of claim 1, wherein the first magnetoresistive sensor stack comprises a first pinned layer with a predetermined magnetic orientation, and wherein the second magnetoresistive sensor stack comprises a second pinned layer with a predetermined magnetic orientation.

7. The sensor device of claim 1, wherein the first magnetoresistive sensor stack comprises a first ferromagnetic reference layer, and wherein the second magnetoresistive sensor stack comprises a second ferromagnetic reference layer.

8. The sensor device of claim 1, wherein the first and second magnetoresistive sensor stacks are operable as a single magnetoresistive sensor element.

9. The sensor device of claim 1, wherein the first magnetic field at the first free layer is essentially equal to the second magnetic field at the second free layer.

10. The sensor device of claim 1, wherein the first magnetic field at the first free layer and the second magnetic field at the second free layer each comprise an external magnetic field to be sensed by the sensor device.

11. An apparatus, comprising:
a movable magnetic device, and
a sensor device adjacent to the movable magnetic device, wherein the sensor device comprises:
a first magnetoresistive sensor stack, the first magnetoresistive sensor stack comprising a first free layer sensitive to a first magnetic field at the first free layer, and
a second magnetoresistive sensor stack provided on top of the first magnetoresistive sensor stack, the second magnetoresistive sensor stack comprising a second free layer sensitive to a second magnetic field at the second free layer,
wherein the first magnetoresistive sensor stack and the second magnetoresistive sensor stack share at least one layer, and wherein at least one of the first or second magnetoresistive sensor stack comprises an antiferromagnetic layer provided adjacent to the respective first or second free layer.

12. The apparatus of claim 11, further comprising a controller, the controller being adapted to control at least one controlled device based on a signal from the sensor device.

13. A method, comprising:
providing a first magnetoresistive sensor stack, the first magnetoresistive sensor stack comprising a first free layer sensitive to a first magnetic field at the first free layer, and
providing a second magnetoresistive sensor stack on top of the first magnetoresistive sensor stack, the second magnetoresistive sensor stack comprising a second free layer sensitive to a second magnetic field at the second free layer, wherein the first magnetoresistive sensor stack and the second magnetoresistive sensor stack share at least one layer and further wherein at least one of the first or second magnetoresistive sensor stack comprises an antiferromagnetic layer provided adjacent to the respective first or second free layer.

14. The method of claim 13, further comprising coupling the first and second magnetoresistive sensor stacks such that the first and second magnetoresistive sensor stacks are operable as a single magnetoresistive element.

15. The sensor device of claim 1, wherein:
the first magnetoresistive sensor stack comprises a first pinned layer between the first free layer and the shared layer; and
the second magnetoresistive sensor stack comprises a second pinned layer between the second free layer and the shared layer.

16. The sensor device of claim 5, wherein:
the first magnetoresistive sensor stack comprises a first pinned layer adjacent the shared antiferromagnetic layer; and
the second magnetoresistive sensor stack comprises a second pinned layer adjacent the shared antiferromagnetic layer,
such that the shared antiferromagnetic layer determines a magnetic orientation of the first pinned layer and the second pinned layer.

\* \* \* \* \*